United States Patent
Preil et al.

(10) Patent No.: US 10,990,019 B2
(45) Date of Patent: Apr. 27, 2021

(54) STOCHASTIC RETICLE DEFECT DISPOSITIONING

(71) Applicant: KLA Corporation, Milpitas, CA (US)

(72) Inventors: Moshe E. Preil, Sunnyvale, CA (US); John J. Biafore, North Scituate, RI (US); Alessandro Vaglio Pret, Austin, TX (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/824,327

(22) Filed: Mar. 19, 2020

(65) Prior Publication Data
US 2020/0326634 A1 Oct. 15, 2020

Related U.S. Application Data

(60) Provisional application No. 62/831,524, filed on Apr. 9, 2019.

(51) Int. Cl.
*G03F 7/20* (2006.01)
*G03F 1/84* (2012.01)

(52) U.S. Cl.
CPC ............ *G03F 7/70591* (2013.01); *G03F 1/84* (2013.01); *G03F 7/705* (2013.01); *G03F 7/7065* (2013.01); *G03F 7/70616* (2013.01)

(58) Field of Classification Search
None
See application file for complete search history.

(56) References Cited

U.S. PATENT DOCUMENTS 8,745,545 B2 * 6/2014 Yang .................. G03F 1/36
716/50
8,910,092 B1 * 12/2014 Shih .................. G03F 1/36
716/53

(Continued)

FOREIGN PATENT DOCUMENTS

| WO | 2018099742 A1 | 6/2018 |
| WO | 2019011604 A1 | 1/2019 |

OTHER PUBLICATIONS

Christopher Hess, Larg H. Weiland, Comparison of Defect Size Distributions Based on Electrical and Optical Measurement Procedures, Proc. IEEE/SEMI 1997 Advanced Semiconductor Manufacturing Conference, vol. 8 (Year: 1997).*

(Continued)

*Primary Examiner* — Lina M Cordero
(74) *Attorney, Agent, or Firm* — Suiter Swantz pc llo

(57) ABSTRACT

A system for stochastic reticle defect dispositioning is disclosed. The system includes a controller including one or more processors and memory. The one or more processors configured to acquire product metrology data of a product reticle. The one or more processors configured to perform one or more stochastic simulations based on the product metrology data to generate one or more simulated product samples including the pattern of elements. The one or more processors configured to generate a product model of the product reticle modeling the printing process of the pattern of elements by the product reticle. The one or more processors configured to identify at least one of a care area of the product reticle which is susceptible to printing stochastic defects on product samples, or a care area on the one or more simulated product samples which is susceptible to printed stochastic defects based on the product model.

28 Claims, 9 Drawing Sheets

(56) References Cited

U.S. PATENT DOCUMENTS

| | | | |
|---|---|---|---|
| 9,087,176 B1* | 7/2015 | Chang | G06F 30/39 |
| 9,934,346 B2 | 4/2018 | Hansen | |
| 10,474,042 B2 | 11/2019 | Biafore et al. | |
| 2002/0102482 A1* | 8/2002 | Smith | G03F 7/70633 |
| | | | 430/22 |
| 2002/0105649 A1* | 8/2002 | Smith | G03F 7/70591 |
| | | | 356/401 |
| 2012/0278768 A1* | 11/2012 | Yang | G03F 7/70441 |
| | | | 716/52 |
| 2014/0199791 A1 | 7/2014 | Park et al. | |
| 2014/0297211 A1* | 10/2014 | Pandev | H01L 22/20 |
| | | | 702/81 |
| 2017/0082921 A1 | 3/2017 | Kim et al. | |
| 2018/0275523 A1 | 9/2018 | Biafore et al. | |
| 2019/0049858 A1* | 2/2019 | Gurevich | G03F 7/70633 |
| 2019/0187570 A1* | 6/2019 | MacK | G03F 7/70441 |
| 2019/0258180 A1* | 8/2019 | Koch | G03F 7/70591 |
| 2019/0317410 A1* | 10/2019 | Hansen | G03F 7/70625 |

OTHER PUBLICATIONS

International Search Report and Written Opinion dated Jul. 23, 2020 for PCT/US2020/026971.

\* cited by examiner

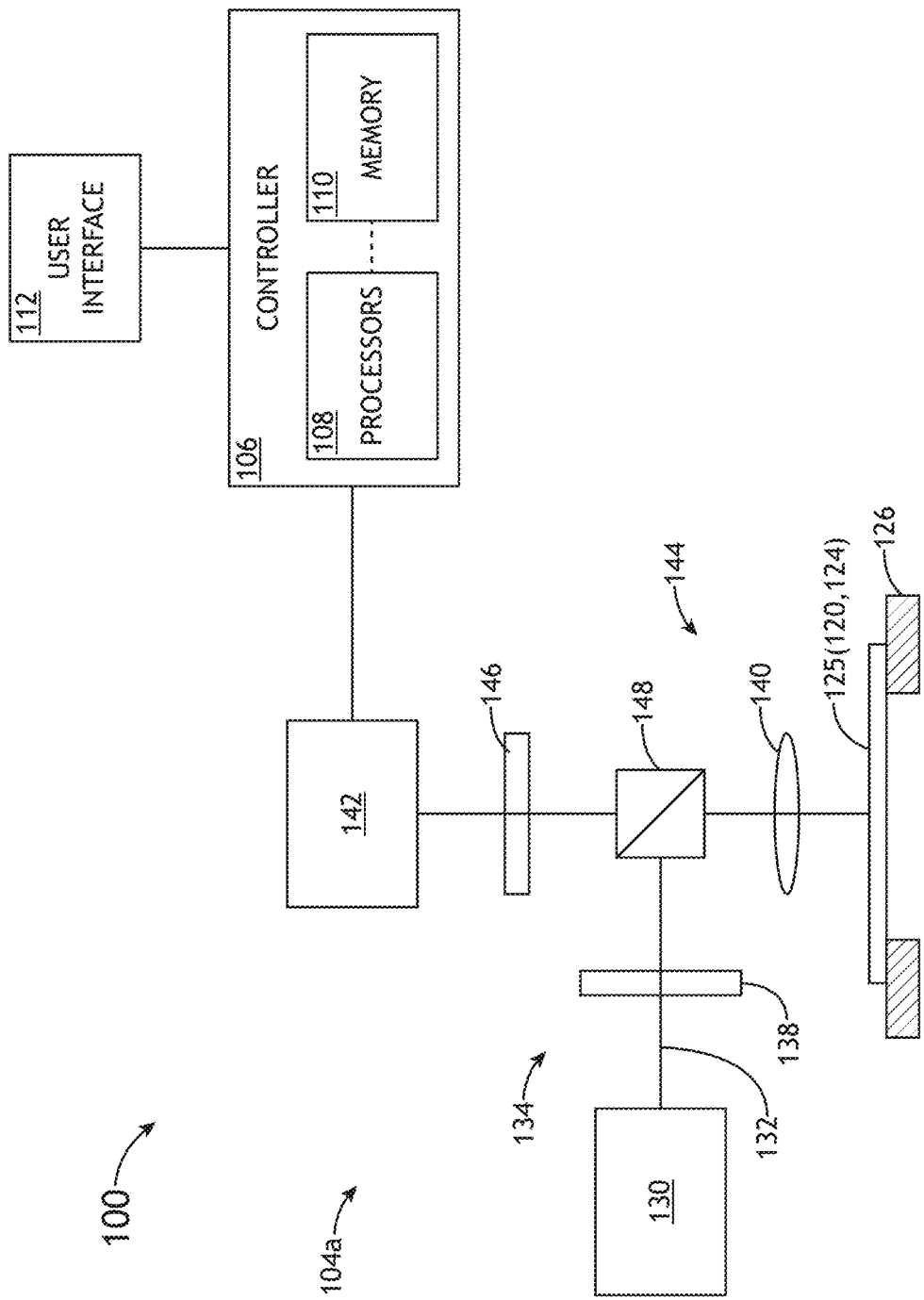

STOCHASTIC RETICLE DEFECT DISPOSITIONING

CROSS-REFERENCE TO RELATED APPLICATION

The present application claims the benefit under 35 U.S.C. § 119(e) of U.S. Provisional Application Ser. No. 62/831,524, filed Apr. 9, 2019, entitled STOCHASTIC RETICLE DEFECT DISPOSITIONING, naming Moshe Preil, John J. Biafore, and Alex Vaglio-Pret as inventors, which is incorporated herein by reference in the entirety.

TECHNICAL FIELD

The present invention relates generally to specimen characterization systems and, more particularly, to a system for identifying stochastic variations in a specimen.

BACKGROUND

Conventional reticle defect dispositioning processes are typically fairly straightforward. If a defect detected on a reticle is above a known threshold size or critical dimension (CD) error, the defect would be known to print on every field of every wafer. Such a defect would result in the reticle being rejected. Conversely, if the defect was below a threshold size or CD error, the defect would not print on every wafer, and could therefore be safely waived according to conventional reticle dispositioning processes. A limited number of defects near the threshold sizes or CD errors may be rejected to allow a certain margin of safety, but conventional reticle defect dispositioning processes typically boil down to a clear pass/fail decision.

However, the growing use of illumination sources with decreasing wavelengths (e.g., extreme ultraviolet (EUV) illumination sources) has complicated this simple pass/fail decision in reticle dispositioning. Decreasing the wavelength of illumination sources in lithography systems may increase stochastic defectivity, which may be described as the occurrence of defects which occur randomly or with a certain probability during fabrication. This increased likelihood of stochastic defects with short-wavelength illumination sources may be associated with a variety of factors including increased photon energy, a reduced number of photons incident on a specimen, stochastic variations in the absorption of these photons, as well as the discrete nature of photochemical reactions within the resist. With decreased wavelengths resulting in increased stochastic defectivity, a given pattern on a reticle which meets all reticle fabrication specifications perfectly may still print a defect on a sample a small but non-zero percentage of the time. These sample defects can not be characterized as reticle defects, but rather are simply characterized as stochastic outliers in the fabrication of patterns on the sample.

Increasing stochastic defectivity renders conventional reticle defect dispositioning processes (e.g., "pass/fail" reticle dispositioning processes) insufficient to accurately disposition reticles and account for stochastic defects. Therefore, there exists a need in the art for a system and method which cure one or more of the shortfalls of the previous approaches identified above.

SUMMARY

A system for stochastic reticle defect dispositioning is disclosed. In embodiments, the system includes a controller including one or more processors configured to execute a set of program instructions stored in memory, the set of program instructions configured to cause the one or more processors to: acquire product metrology data of a product reticle, the product reticle configured to be used to print a pattern of elements on one or more product samples; perform one or more stochastic simulations of a printing process based on the product metrology data of the product reticle to generate one or more simulated product samples including the pattern of elements; generate a product model of the product reticle modeling the printing process of the pattern of elements by the product reticle; and identify at least one of a care area of the product reticle which is susceptible to printing stochastic defects on product samples, or a care area on the one or more simulated product samples which is susceptible to printed stochastic defects based on the product model.

A system for stochastic reticle defect dispositioning is disclosed. In embodiments, the system includes a controller including one or more processors configured to execute a set of program instructions stored in memory, the set of program instructions configured to cause the one or more processors to: acquire reference metrology data of a pattern of elements to be printed on one or more reference samples; generate a reference model for the pattern of elements based on the reference metrology data; acquire product metrology data of a product reticle, the product reticle configured to be used to print the pattern of elements on one or more product samples; perform one or more stochastic simulations of a printing process based on the product metrology data of the product reticle to generate one or more simulated product samples including the pattern of elements; generate a product model for the product reticle modeling the printing process of the pattern of elements by the product reticle; identify one or more differences between the product model and the reference model; and identify, based on the one or more identified differences, at least one of a care area of the product reticle which is susceptible to printing stochastic defects on the one or more product samples, or a care area on the one or more product samples which is susceptible to printed stochastic defects.

A method for identifying stochastic defects is disclosed. In embodiments, the method includes: acquiring product metrology data of a product reticle, the product reticle configured to be used to print a pattern of elements on one or more product samples; performing one or more stochastic simulations of a printing process based on the product metrology data of the product reticle to generate one or more simulated product samples including the pattern of elements; generating a product model of the product reticle modeling the printing process of the pattern of elements by the product reticle; and identifying at least one of a care area of the product reticle which is susceptible to printing stochastic defects on product samples, or a care area on the one or more simulated product samples which is susceptible to printed stochastic defects.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3A is a simplified block diagram view of a metrology sub-system of a system for characterizing a specimen, in accordance with one or more embodiments of the present disclosure.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

The use of illumination sources (e.g., lithography system illumination sources) with decreasing wavelengths has been found to increase stochastic defectivity, which may be described as the occurrence of defects which occur randomly or with a certain probability during fabrication. This increased likelihood of stochastic defects with short-wavelength illumination sources may be associated with a variety of factors including increased photon energy, a reduced number of photons incident on a specimen, stochastic variations in the absorption of these photons, as well as the discrete nature of photochemical reactions within the resist. With decreased wavelengths resulting in increased stochastic defectivity, a given pattern on a reticle which meets all reticle fabrication specifications perfectly may still print a defect on a sample a small but non-zero percentage of the time. These sample defects can not be characterized as reticle defects, but rather are simply characterized as stochastic outliers in the fabrication of patterns on the sample.

Figure 5:
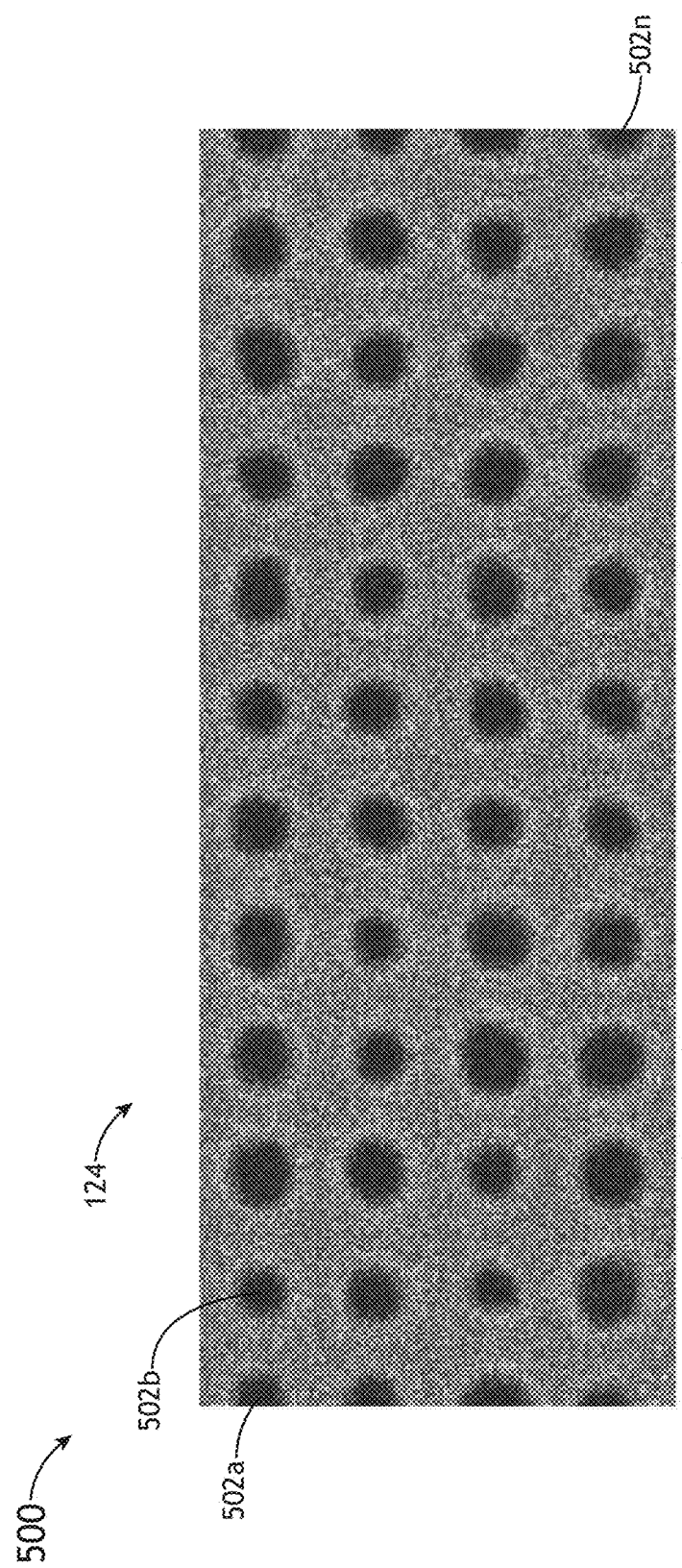
FIG. 5 is an image illustrating stochastic variation between contact holes of a sample, in accordance with one or more embodiments of the present disclosure.

For example, consider a reticle which is used to print a plurality of contact holes on a sample. For instance, FIG. 5 is an image 500 illustrating stochastic variation between contact holes 502a-502n of a sample 124, in accordance with one or more embodiments of the present disclosure. In this example, the reticle may exhibit a defect which is not large enough to print on every sample 124 such that it is considered a "repeating defect," but which may significantly impact the rate of stochastic failures. Thus, the defect may not be significant enough to reject the reticle, but will still print stochastic defects on a sample 124 a non-zero percentage of the time. For instance, as shown in FIG. 5, a reticle used in printing processes may be configured to fabricate a pattern of elements (e.g., contact holes 502a-502n) on a sample 124. Ideally, the contact holes 502a-502n printed on the sample 124 may be identical. However, small "defects" in the reticle used to print the contact holes 502a-502n may result in stochastic variation/stochastic defects in the contact holes 502a-502n, as may be seen in the varying sizes (e.g., critical dimensions (CD)) and shapes of the contact holes 502a-502n. Conventional reticle dispositioning techniques would be unable to accurately characterize, identify, or disposition the effects of such stochastic variation on the defective pattern far out into the tails of a CD distribution of the contact holes printed by the reticle. Therefore, conventional reticle defect dispositioning processes (e.g., "pass/fail" reticle dispositioning processes) have been found to be insufficient to accurately disposition reticles and account for stochastic defects.

Accordingly, embodiments of the present disclosure are directed to a system and method which cure one or more of the shortfalls of the previous approaches identified above. Embodiments of the present disclosure are directed to a system for identifying stochastic variation/defects within a reticle and/or samples printed by a reticle. More particularly, embodiments of the present disclosure are directed to a system and method for modeling stochastic defectivity of a reticle based on metrology data of the reticle. Additional embodiments of the present disclosure are directed to a system configured to simulate numerous replications of a printing process of a reticle in order to quantify the impact of stochastic variation on overall sample yield. It is contemplated herein that embodiments of the present disclosure may enable more nuanced reticle dispositioning able to more efficiently and reliably quantify stochastic variation.

Figure 1:
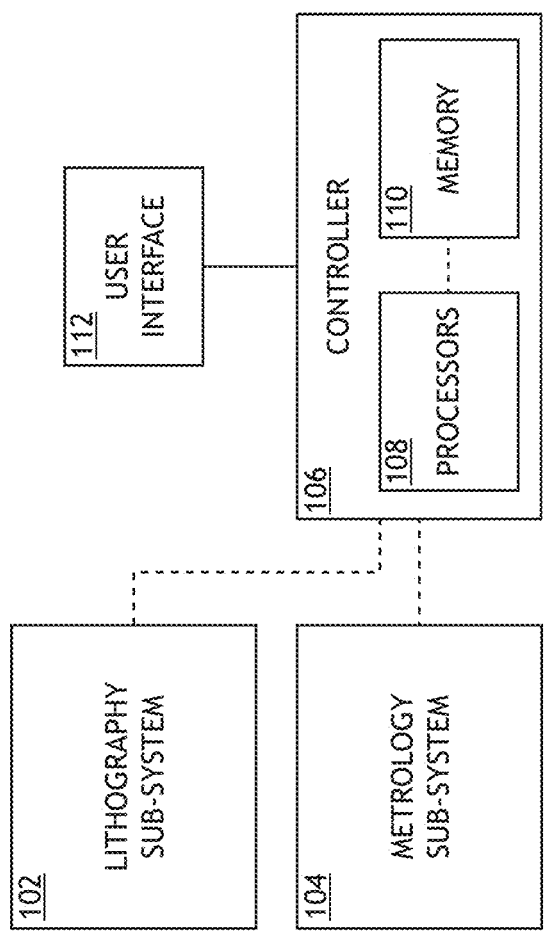
FIG. 1 is a simplified block diagram view of a system for characterizing a specimen, in accordance with one or more embodiments of the present disclosure.

FIG. 1 is a simplified block diagram view of a system 100 for characterizing a specimen, in accordance with one or more embodiments of the present disclosure. In particular, FIG. 1A illustrates a system 100 for identifying stochastic variation/defects on reticles and/or samples fabricated by reticles. The system 100 may include, but is not limited to, one or more lithography sub-systems 102 and one or more metrology sub-systems 104. The system 100 may further include a controller 106 including one or more processors 108, a memory 110, and a user interface 112.

In one embodiment, the system 100 includes a lithography sub-system 102 for lithographically printing one or more patterns (e.g., device patterns, metrology patterns, or the like) on a sample. The lithography sub-system 102 may include any lithographic printing tool known in the art including, but not limited to, a scanner or stepper. In embodiments, the lithography sub-system 102 may utilize one or more reticles in order to print structures and other patterns of elements on a sample.

In another embodiment, the system 100 includes a metrology sub-system 104 configured to characterize a specimen. For the purposes of the present disclosure, the term "specimen" may be used to refer to any reticle, sample, wafer, or other object which may be characterized/measured by the metrology sub-system 104. For example, the metrology sub-system 104 may be configured to acquire images of a reticle (e.g., a pattern mask including a pattern of device elements to be exposed onto a sample by the lithography sub-system 102) used by the lithography sub-system 102 in order to measure and characterize features/structures of the reticle. In this regard, the metrology sub-system 104 may measure one or more portions of the reticle which are susceptible to printing stochastic defects. By way of another example, the metrology sub-system 104 may be configured to acquire images of samples fabricated by the reticle/lithography sub-system 102 in order to measure and characterize patterns of elements printed on the samples. In this regard, the metrology sub-system 104 may measure patterns of elements printed on a sample which are susceptible to stochastic defects.

In a general sense, the metrology sub-system 104 may measure any metrology metric including, but not limited to, overlay error, pattern placement error, critical dimensions (CD), dimensions of sample features, sidewall angle, line edge roughness, pattern placement errors (PPE), edge placement errors (EPE), bridges, micro-breaks in line patterns, tip-to-tip line end merging, and the like. The metrology sub-system 104 may be configured to measure metrology metrics using any method known in the art. In one embodiment, the metrology sub-system 104 includes an image-based metrology tool to measure metrology data based on the generation of one or more images of a specimen (e.g., a reticle, a sample, or the like). In another embodiment, the metrology sub-system 104 includes a scatterometry-based metrology system to measure metrology data based on the scattering (reflection, diffraction, diffuse scattering, or the like) of light from the specimen.

In another embodiment, the system 100 includes a controller 106 communicatively coupled to the lithography sub-system 102 and/or metrology sub-system 104. The controller 106 may include a user interface 112 communicatively coupled to the controller 106, the user interface 112 configured to display data of system 100 to a user and/or receive input commands from a user. In another embodiment, the controller 106 includes one or more processors 108 configured to execute program instructions maintained on a memory 110, wherein the program instructions are configured to cause the one or more processors 108 to carry out the various steps/functions of the present disclosure. In this regard, the one or more processors 108 of controller 106 may execute any of the various process steps described throughout the present disclosure.

Figure 2:
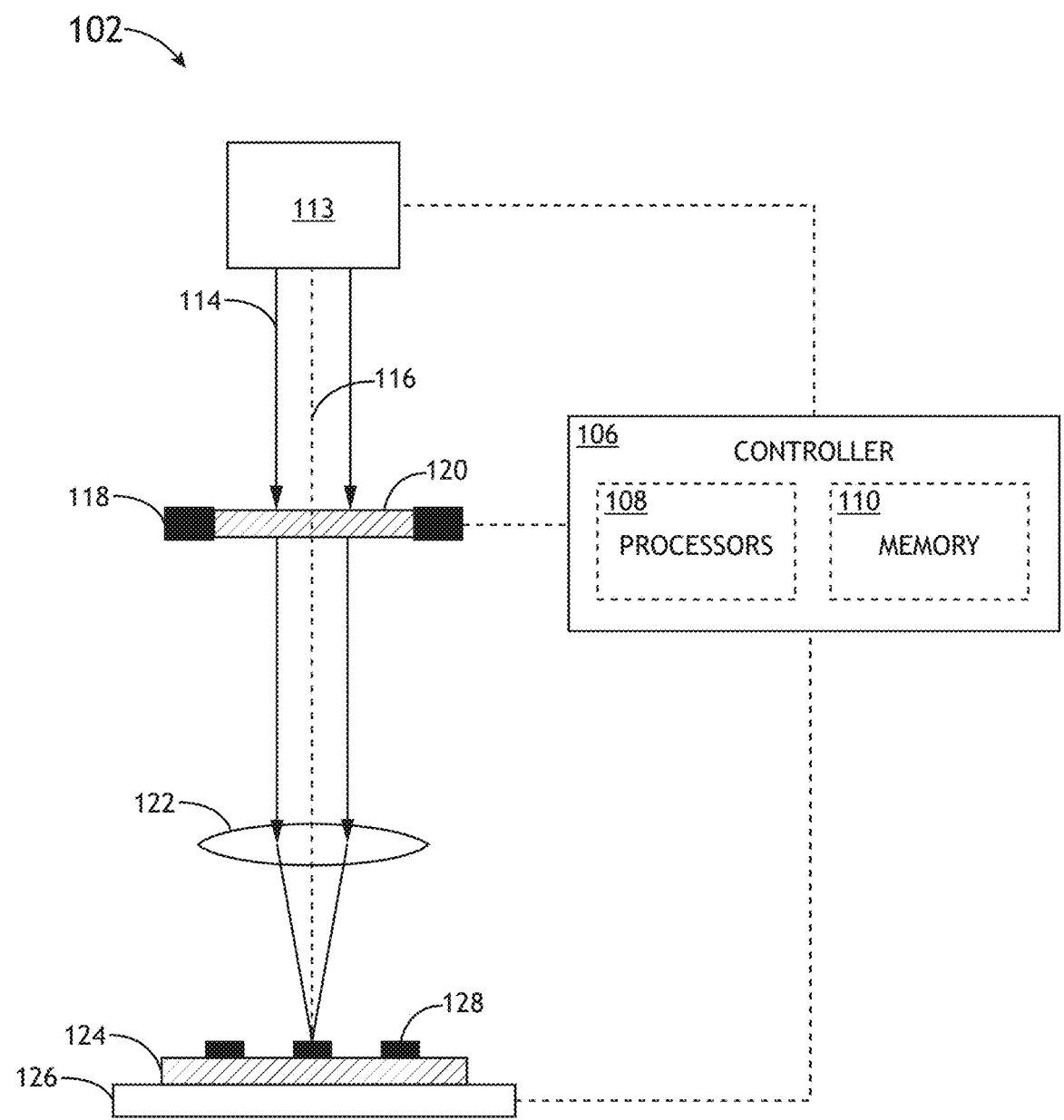
FIG. 2 is a simplified block diagram view of a lithography sub-system, in accordance with one or more embodiments of the present disclosure.

FIG. 2 is a simplified block diagram view of a lithography sub-system, in accordance with one or more embodiments of the present disclosure. In one embodiment, the lithography sub-system 102 includes a lithography illumination source 113 configured to generate one or more illumination beams 114. The one or more illumination beams 114 may include one or more selected wavelengths of light including, but not limited to, ultraviolet (UV) radiation, extreme ultraviolet (EUV) radiation, visible radiation, infrared (IR) radiation, and the like.

The lithography illumination source 113 may include any type of illumination source known in the art suitable for generating an illumination beam 114. For example, the lithography illumination source 113 may include one or more laser systems (e.g., gas lasers, diode lasers, free-electron lasers, fiber lasers, disk lasers, for the like). By way of another example, the lithography illumination source 113 may include one or more lamp systems (e.g., arc lamps, or the like). By way of another example, the lithography illumination source 113 includes a plasma illumination source (e.g., a laser-pulsed plasma (LPP) source, a discharge pumped plasma (DPP) source, a laser-sustained plasma (LSP) source, or the like).

The lithography illumination source 113 may additionally include any number of optical elements suitable for manipulating one or more aspects of the illumination beam 114 such as, but not limited to, filters, polarizers, waveplates, or diffusers.

Illumination from the lithography illumination source 113 may have any spatial distribution (e.g., illumination pattern). For example, the lithography illumination source 113 may include, but is not limited to, a single-pole illumination source, a dipole illumination source, a C-Quad illumination source, a Quasar illumination source, or a free-form illumination source. In this regard, the lithography illumination source 113 may generate an on-axis illumination beams 114 in which illumination propagates along (or parallel to) an optical axis 116 and/or any number of off-axis illumination beams 114 in which illumination propagates at an angle to the optical axis 116.

In another embodiment, the lithography sub-system 102 includes a mask support device 118. The mask support device 118 is configured to secure a pattern mask 120 (e.g., reticle 120) including a pattern of elements to be exposed during fabrication of samples. In another embodiment, the lithography sub-system 102 includes a set of projection optics 122 configured to project an image of the reticle 120 illuminated by the one or more illumination beams 114 onto a lithography sample 124 disposed on a sample stage 126 in order to generate printed pattern elements corresponding to the image of the reticle 120. In another embodiment, the mask support device 118 may be configured to actuate or position the reticle 120. For example, the mask support device 118 may actuate the reticle 120 to a selected position with respect to the projection optics 122 of the system 100.

As used throughout the present disclosure, the term "lithography sample" or "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. For the purposes of the present disclosure, the terms "lithography sample," "sample," and "wafer" should be interpreted as interchangeable.

The sample 124 may include any number of photosensitive materials and/or material layers suitable for receiving the image of the reticle 120. For example, the sample 124 may include a resist layer 128. In this regard, the set of projection optics 122 may project an image of the reticle 120 onto on the resist layer 128 to expose the resist layer 128 and a subsequent etching step may remove the exposed material (e.g., positive etching) or the unexposed material (e.g., negative etching) in order to provide printed features on the sample 124. Further, the reticle 120 may be utilized in any imaging configuration known in the art. For example, the reticle 120 may be a positive mask (e.g., a bright-field mask) in which pattern elements are positively imaged as printed pattern elements. By way of another example, the reticle 120 may be a negative mask (e.g., a dark-field mask) in which pattern elements of the reticle 120 form negative printed pattern elements (e.g., gaps, spaces, or the like).

The controller 106 may be communicatively coupled to any number of elements in the lithography sub-system 102. For example, the controller 106 may be communicatively coupled to the mask support device 118, the lithography illumination source 113, and/or the sample stage 126 to direct the exposure of pattern elements on a reticle 120 to a sample 124 (e.g., a resist layer 128 on the sample, or the like). In this regard, exposure conditions such as the exposure dose, the focal position of the reticle 120, sample 124, and the like within the lithography sub-system 102 may be adjusted.

FIG. 3A is a simplified block diagram view of a metrology sub-system 104, in accordance with one or more embodiments of the present disclosure. In particular, FIG. 3A illustrates a system 100 including an optical metrology sub-system 104*a*.

In one embodiment, the metrology sub-system 104*a* includes a metrology illumination source 130 to generate a metrology illumination beam 132. In another embodiment, the metrology illumination source 130 is the same as the lithography illumination source 113. In a further embodiment, the metrology illumination source 130 is a separate illumination source configured to generate a separate metrology illumination beam 132. The metrology illumination beam 132 may include one or more selected wavelengths of light including, but not limited to, ultraviolet (UV) radiation, extreme ultraviolet (EUV) radiation, visible radiation, infrared (IR) radiation, and the like.

In another embodiment, the metrology illumination source 130 directs the metrology illumination beam 132 to a metrology specimen 125 via an illumination pathway 134. As used throughout the present disclosure, the term "metrology specimen 125" generally refers to an object to be inspected by the metrology sub-system 104*a*. For example, the metrology specimen 125 may include, but is not limited to, the reticle 120, the sample 124, and the like. In this regard, the metrology sub-system 104*a* may operate as a reticle inspection sub-system and/or a wafer inspection sub-system.

The illumination pathway 134 may include one or more lenses or additional optical components 138 suitable for modifying and/or conditioning the metrology illumination beam 132. For example, the one or more optical components 138 may include, but are not limited to, polarizers, filters, beam splitters, diffusers, homogenizers, apodizers, beam shapers, and the like. In another embodiment, the metrology sub-system 104*a* includes an objective lens 140 to focus the metrology illumination beam 132 onto the metrology specimen 125.

In another embodiment, the metrology sub-system 104*a* includes a detector 142 configured to capture radiation emanating from the metrology specimen 125 through a collection pathway 144. For example, the detector 142 may be configured to receive one or more images of the sample 124 and/or reticle 120 provided by elements in the collection pathway 144 (e.g., the objective lens 140, lenses 146, or the like). The detector 142 may receive radiation reflected or scattered (e.g., via specular reflection, diffuse reflection, and the like) from the metrology specimen 125, radiation generated by the metrology specimen 125 (e.g., luminescence associated with absorption of the metrology illumination beam 132, or the like), and the like. By way of another example, the detector 142 may receive one or more diffracted orders of radiation from the metrology specimen 125 (e.g., 0-order diffraction, ±1 order diffraction, ±2 order diffraction, and the like).

The detector 142 may include any type of optical detector known in the art suitable for measuring illumination received from the metrology specimen 125. For example, a detector 142 may include, but is not limited to, a charge-coupled device (CCD) detector, a time delay integration (TDI) detector, a photomultiplier tube (PMT), an avalanche photodiode (APD), or the like. In another embodiment, a detector 142 may include a spectroscopic detector suitable for identifying wavelengths of radiation emanating from the metrology specimen 125. In another embodiment, the metrology sub-system 104*a* may include multiple detectors 142 (e.g., associated with multiple beam paths generated by one or more beam splitters to facilitate multiple metrology measurements (e.g., multiple metrology tools) by the metrology sub-system 104*a*.

The collection pathway 144 may further include any number of optical elements to direct and/or modify illumination collected by the objective lens 140 including, but not limited to one or more lenses 146, one or more filters, one or more polarizers, or one or more beam blocks.

In one embodiment, as illustrated in FIG. 3A, the metrology sub-system 104*a* may include a beam splitter 148 oriented such that the objective lens 140 may simultaneously direct the metrology illumination beam 132 to the metrology specimen 125 and collect radiation emanating from the metrology specimen 125. In this regard, the metrology sub-system 104*a* may be configured in an epi-illumination mode. In another embodiment, the angle of incidence of the metrology illumination beam 132 on the metrology specimen 125 is adjustable. For example, the path of the metrology illumination beam 132 through the beam splitter 148 and the objective lens 140 may be adjusted to control the angle of incidence of the metrology illumination beam 132 on the metrology specimen 125. In this regard, the metrology illumination beam 132 may have a nominal path through the beam splitter 148 and the objective lens 140 such that the metrology illumination beam 132 has a normal incidence angle on the metrology specimen 125. Further, the angle of incidence of the metrology illumination beam 132 on the metrology specimen 125 may be controlled by modifying the position and/or angle of the metrology illumination beam 132 on the beam splitter 148 (e.g., by rotatable mirrors, a spatial light modulator, a free-form illumination source, or the like). In another embodiment, the metrology illumination source 130 directs the one or more metrology illumination beam 132 to the metrology specimen 125 at an angle (e.g., a glancing angle, a 45-degree angle, or the like).

Figure 3B:
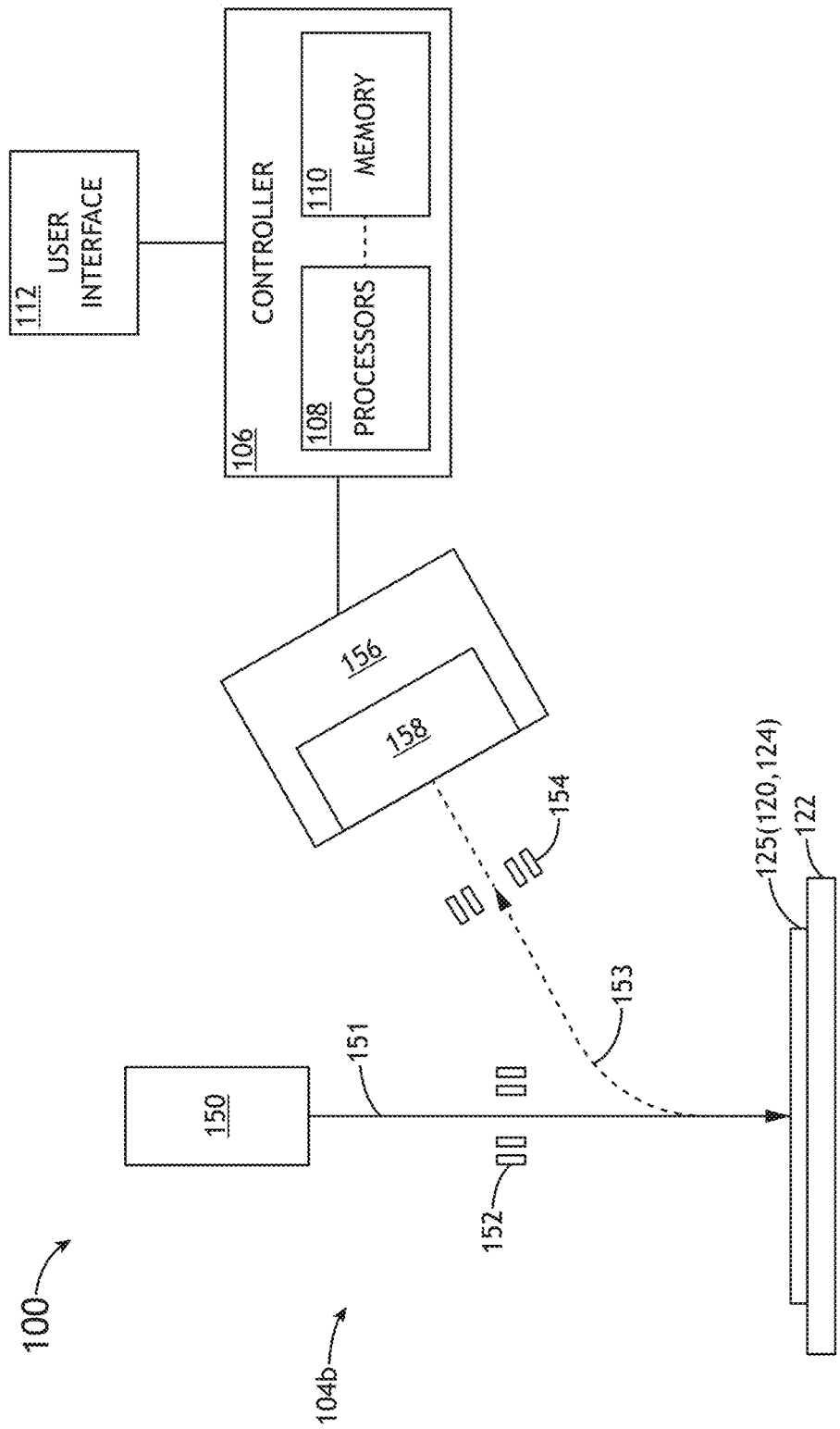
FIG. 3B is a simplified block diagram view of a metrology sub-system of a system for characterizing a specimen, in accordance with one or more embodiments of the present disclosure.

FIG. 3B is a simplified block diagram view of a metrology sub-system, in accordance with one or more embodiments of the present disclosure. In particular, FIG. 3B illustrates a system 100 including an SEM metrology sub-system 104*b*.

In one embodiment, the SEM metrology sub-system 104*b* is configured to perform one or more measurements on the metrology specimen 125. In this regard, the SEM metrology sub-system 104*b* may be configured to acquire one or more images of the metrology specimen 125. The SEM metrology sub-system 104*b* may include, but is not limited to, electron beam source 150, one or more electron-optical elements 152, one or more electron-optical elements 154, and an electron detector assembly 156 including one or more electron sensors 158.

In one embodiment, the electron beam source 150 is configured to direct one or more electron beams 151 to the metrology specimen 125 (e.g., reticle 120, sample 124). The electron beam source 150 may form an electron-optical column. In another embodiment, electron beam source 150 includes one or more additional and/or alternative electron-optical elements 152 configured to focus and/or direct the one or more electron beams 151 to the surface of the metrology specimen 125. In another embodiment, SEM metrology sub-system 104*b* includes one or more electron-optical elements 154 configured to collect secondary and/or backscattered electrons 153 emanated from the surface of the metrology specimen 125 in response to the one or more electron beams 151. It is noted herein that the one or more electron-optical elements 152 and the one or more electron-optical elements 154 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

It is noted that the electron optical assembly of the SEM metrology sub-system 104b is not limited to the electron-optical elements depicted in FIG. 3B, which are provided merely for illustrative purposes. It is further noted that the system 100 may include any number and type of electron-optical elements necessary to direct/focus the one or more electron beams 151 onto the metrology specimen 125 and, in response, collect and image the emanated secondary and/or backscattered electrons 153 onto the electron detector assembly 134.

For example, the system 100 may include one or more electron beam scanning elements (not shown). For instance, the one or more electron beam scanning elements may include, but are not limited to, one or more electromagnetic scanning coils or electrostatic deflectors suitable for controlling a position of the one or more electron beams 151 relative to the surface of the metrology specimen 125. Further, the one or more scanning elements may be utilized to scan the one or more electron beams 151 across the metrology specimen 125 in a selected pattern.

In another embodiment, secondary and/or backscattered electrons 153 are directed to one or more sensors 158 of the electron detector assembly 156. The electron detector assembly 156 of the SEM metrology sub-system 104b may include any electron detector assembly known in the art suitable for detecting backscattered and/or secondary electrons 153 emanating from the surface of the metrology specimen 125. In one embodiment, the electron detector assembly 156 includes an electron detector array. In this regard, the electron detector assembly 156 may include an array of electron-detecting portions. Further, each electron-detecting portion of the detector array of the electron detector assembly 156 may be positioned so as to detect an electron signal from metrology specimen 125 associated with one of the incident one or more electron beams 151. The electron detector assembly 156 may include any type of electron detector known in the art. For example, the electron detector assembly 156 may include a micro-channel plate (MCP), a PIN or p-n junction detector array, such as, but not limited to, a diode array or avalanche photo diodes (APDs). By way of another example, the electron detector assembly 156 may include a high-speed scintillator or a photomultiplier tube (PMT) detector.

While FIG. 3B illustrates the SEM metrology sub-system 104b as including an electron detector assembly 156 comprising only a secondary electron detector assembly, this is not to be regarded as a limitation of the present disclosure. In this regard, it is noted that the electron detector assembly 156 may include, but is not limited to, a secondary electron detector, a backscattered electron detector, and/or a primary electron detector (e.g., an in-column electron detector). In another embodiment, SEM metrology sub-system 104b may include a plurality of electron detector assemblies 134. For example, system 100 may include a secondary electron detector assembly 134a, a backscattered electron detector assembly 134b, and an in-column electron detector assembly 134c.

In one embodiment, the one or more processors 108 of the controller 106 are configured to analyze the output of detector assembly 142/electron detector assembly 156. In one embodiment, the set of program instructions are configured to cause the one or more processors 108 to analyze one or more characteristics of metrology specimen 125 based on images received from the detector assembly 142/electron detector assembly 156. In another embodiment, the set of program instructions are configured to cause the one or more processors 108 to modify one or more characteristics of system 100 in order to maintain focus on the metrology specimen 125 and/or the detector assembly 142/electron detector assembly 156. For example, the one or more processors 108 may be configured to adjust one or more characteristics of the illumination source 113/electron beam source 150 and/or other elements of system 100 in order to focus the illumination 132 and/or one or more electron beams 151 onto the surface of the metrology specimen 125. By way of another example, the one or more processors 108 may be configured to adjust the one or more elements of system 100 in order to collect illumination and/or secondary electrons 153 from the surface of the metrology specimen 125 and focus the collected illumination on the detector assembly 142/electron detector assembly 156. By way of another example, the one or more processors 108 may be configured to adjust one or more focusing voltages applied to one or more electrostatic deflectors of electron beam source 150 in order to independently adjust the position or alignment of the one or more electron beams 151 and scan the electron beams 151 across the metrology specimen 125.

In another embodiment, as shown in FIGS. 1-3B, system 100 includes a user interface 112 communicatively coupled to the controller 106. In another embodiment, the user interface 112 includes a user input device and a display. The user input device of the user interface 112 may be configured to receive one or more input commands from a user, the one or more input commands configured to input data into system 100 and/or adjust one or more characteristics of system 100. In another embodiment, the display of the user interface 112 may be configured to display data of system 100 to a user.

As noted previously herein, the one or more processors 108 are configured to execute a set of program instructions stored on memory 110, the set of program instructions configured to cause the one or more processors 108 to carry out various functions and steps of the present disclosure. In this regard, the controller 106/processors 108 may be configured to: acquire product metrology data of a product reticle, the product reticle configured to be used to print a pattern of elements on one or more product samples; perform one or more stochastic simulations of a printing process based on the product metrology data of the product reticle to generate one or more simulated product samples including the pattern of elements; generate a product model of the product reticle modeling the printing process of the pattern of elements by the product reticle; identify at least one of a care area of the product reticle which is susceptible to printing stochastic defects on product samples, or a care area on the one or more simulated product samples which is susceptible to printed stochastic defects based on the product model. Each of these steps/functions of the controller 106 will each be described in further detail herein with reference to FIGS. 4A-4B.

Figure 4A:
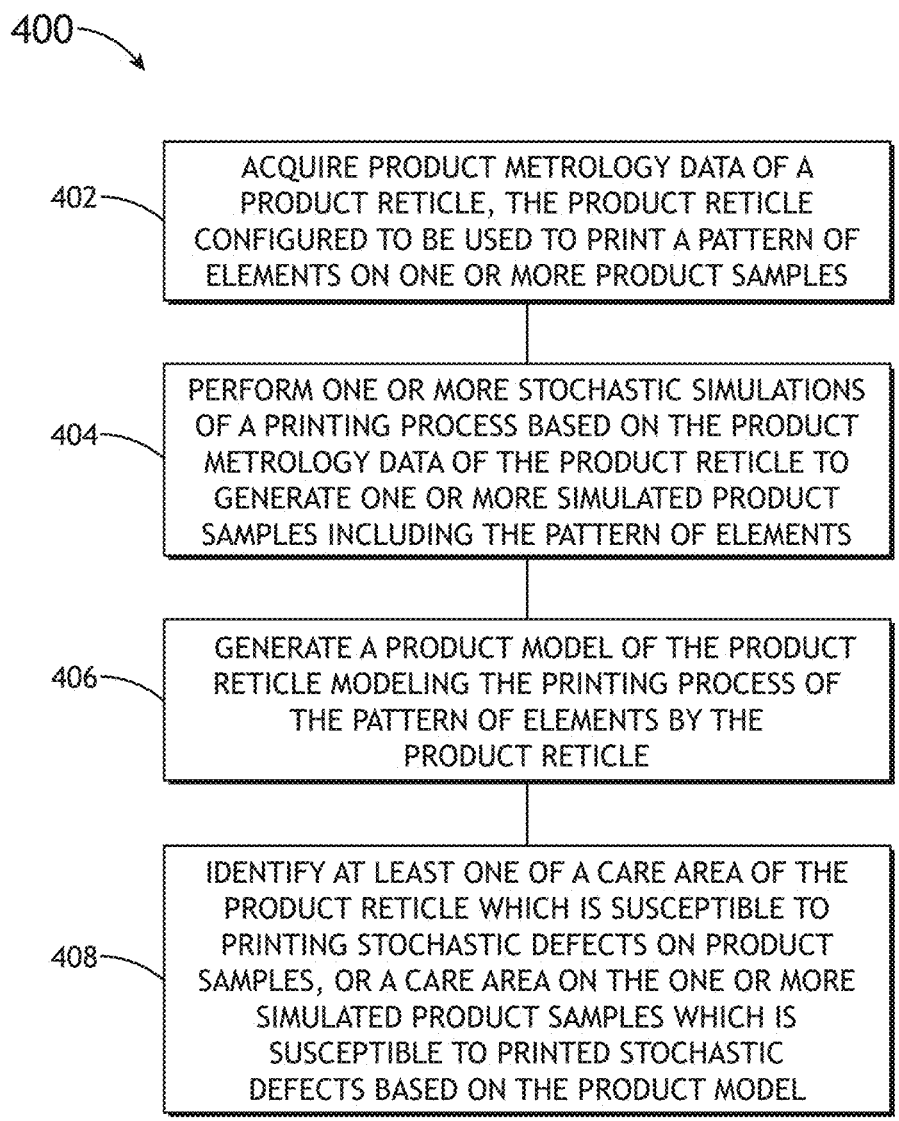
FIG. 4A illustrates a flowchart of a method for identifying stochastic defects on a specimen, in accordance with one or more embodiments of the present disclosure.

FIG. 4A illustrates a flowchart of a method 400 for identifying stochastic defects on a specimen 125 (e.g., reticle 120, sample 124), in accordance with one or more embodiments of the present disclosure. It is noted herein that the steps of method 400 may be implemented all or in part by system 100. It is further recognized, however, that the method 400 is not limited to the system 100 in that additional or alternative system-level embodiments may carry out all or part of the steps of method 400.

In a step 402, product metrology data of a product reticle 120 is acquired. In embodiments, the product reticle 120 may be configured to be used in one or more printing processes to print a pattern of elements on one or more product samples 124. In this regard, the product reticle 120 may be used by the lithography sub-system 102 to perform printing processes to fabricate product samples 124. As it is used herein, the term "product reticle" may be used to refer to a reticle 120 which is to be inspected for stochastic variability, and which may be used to fabricate product samples 124 if it is determined to pass inspection. In this regard, a product reticle 120 may be understood to include features/defects which are susceptible to printing stochastic defects.

Comparatively, the term "reference reticle" may be used to refer to a reticle 120 which is known to exhibit good stochastic variability. In this regard, a reference reticle 120 may be known to utilize one or more printing processes in order to fabricate reference samples 124 with low stochastic variability. Accordingly, it is contemplated herein that the stochastic variability of a product reticle 120 may be evaluated by comparing stochastic defects on product samples 124 fabricated via the product reticle 120 to stochastic defects on reference samples 124 fabricated with printing processes performed with a reference reticle 120. The distinction between product and reference reticles 120 (as well as product and reference samples 124) will be discussed in further detail herein.

It is noted herein that the pattern of elements printed on product samples 124 via printing processes applied via the product reticle 120 may include any structures, patterns, or elements known in the art. For example, the pattern of elements may include one or more device elements corresponding to features to be fabricated as part of an operational semiconductor device or one or more metrology targets. For instance, the pattern of elements printed by the product reticle may include, but are not limited to, contact holes (e.g., contact holes 502a-502n in FIG. 5), gratings, overlay targets, exposure-sensitive targets, targets sensitive to the focal position of the sample 124, or the like. In this regard, the susceptibility of any portion of the pattern of elements to stochastic defects/variation may be characterized.

Product metrology data of a product reticle 120 may be acquired from any source known in the art. For example, the controller 106 may be configured to generate one or more control signals configured to cause the metrology sub-system 104 to acquire one or more images of a product reticle 120 (e.g., metrology specimen 125). The acquired images may include optical images from the optical metrology sub-system 104a and/or SEM images from the SEM metrology sub-system 104b. The controller 106 may then be configured to receive the acquired images and generate product metrology data of the product reticle 120 based on the acquired images.

In additional and/or alternative embodiments, the product metrology data of the product reticle 120 may be based on design data of the product reticle 120 itself. Design data of the product reticle 120 may include a fabrication recipe used to fabricate the product reticle 120. For example, design data (e.g., a fabrication recipe) associated with the product reticle 120 may be stored in memory 110 and/or a remote memory or server. In this example, the controller 106 may be configured to acquire the product metrology data of the product reticle 120 based on the design data of the product reticle 120. In embodiments, the controller 106 may be configured to store product metrology data of the product reticle 120 in memory 110.

In a step 404, one or more stochastic simulations of a printing process are performed based on the product metrology data of the product reticle 120 to generate one or more simulated product samples including the pattern of elements. As it is used herein, the term "simulated product samples" may be used to refer to theoretical product samples generated via one or more stochastic simulations. In this regard, simulated product samples may include examples of samples 124 which may be generated if the simulated printing processes utilizing the reticle were performed with the lithography sub-system 102.

For example, the controller 106 may be configured to retrieve product metrology data of the product reticle 120 stored in memory, and perform one or more stochastic simulations of a printing process in order to generate one or more simulated product samples. Data associated with the simulated product samples may be stored in memory 110. In embodiments, the controller 106 may perform stochastic simulations of one or more printing processes in order to simulate the fabrication of the pattern of elements on the simulated product samples. For instance, the controller 106 may be configured to perform two-thousand stochastic simulations of a printing process in order to generate two-thousand simulated product samples, thereby simulating the fabrication of the pattern of elements two-thousand times over.

The controller 106 may be configured to perform the stochastic simulations based on a production recipe stored in memory 110 or retrieved from an external memory, network, or the like. The production recipe may include any data associated with the printing process including, but not limited to, position of the product reticle 120 and/or simulated product samples, pattern of elements to be printed, characteristics of the lithography sub-system 102, exposure parameters (e.g., lithography illumination source 113 wavelength, illumination dose, focal position of the simulated product samples, exposure time, spatial profile of the lithography illumination source 113, spatial distribution of illumination on the simulated product samples, and the like).

It is noted herein that the controller 106 may be configured to perform stochastic simulations of a printing process using the product reticle 120 in order to determine the printability of defects on the product reticle 120, and the impact of stochastic variation on the pattern of elements printed on the simulated product samples and/or future samples 124. The controller 106 may be configured to perform the one or more stochastic simulations using any simulation or modeling technique known in the art. For example, the controller 106 may be configured to perform one or more Monte Carlo simulations of the printing process.

In a step 406, a product model of the product reticle 120 modeling the printing process of the pattern of elements by the product reticle is generated. In embodiments, the product model may be generated based on the generated simulated product samples. For example, the controller 106 may be configured to acquire simulated metrology data of the one or more simulated product samples, and generate the product model based on the simulated metrology data. For instance, in the context of a product reticle 120 used to print contact holes (e.g., contact holes 502a-502n in FIG. 5), the controller 106 may be configured to acquire critical dimensions (e.g., simulated metrology data) of the simulated contact holes printed on the simulated product samples. Subsequently, based on the acquired critical dimensions (e.g., simulated metrology data), the controller 106 may generate a product model which models the printing process of the contact holes on the simulated product samples.

In embodiments, the product model may include any model known in the art which models the printing processes performed by the product reticle 120. This may be further understood with reference to FIGS. 6-7.

Figure 6:
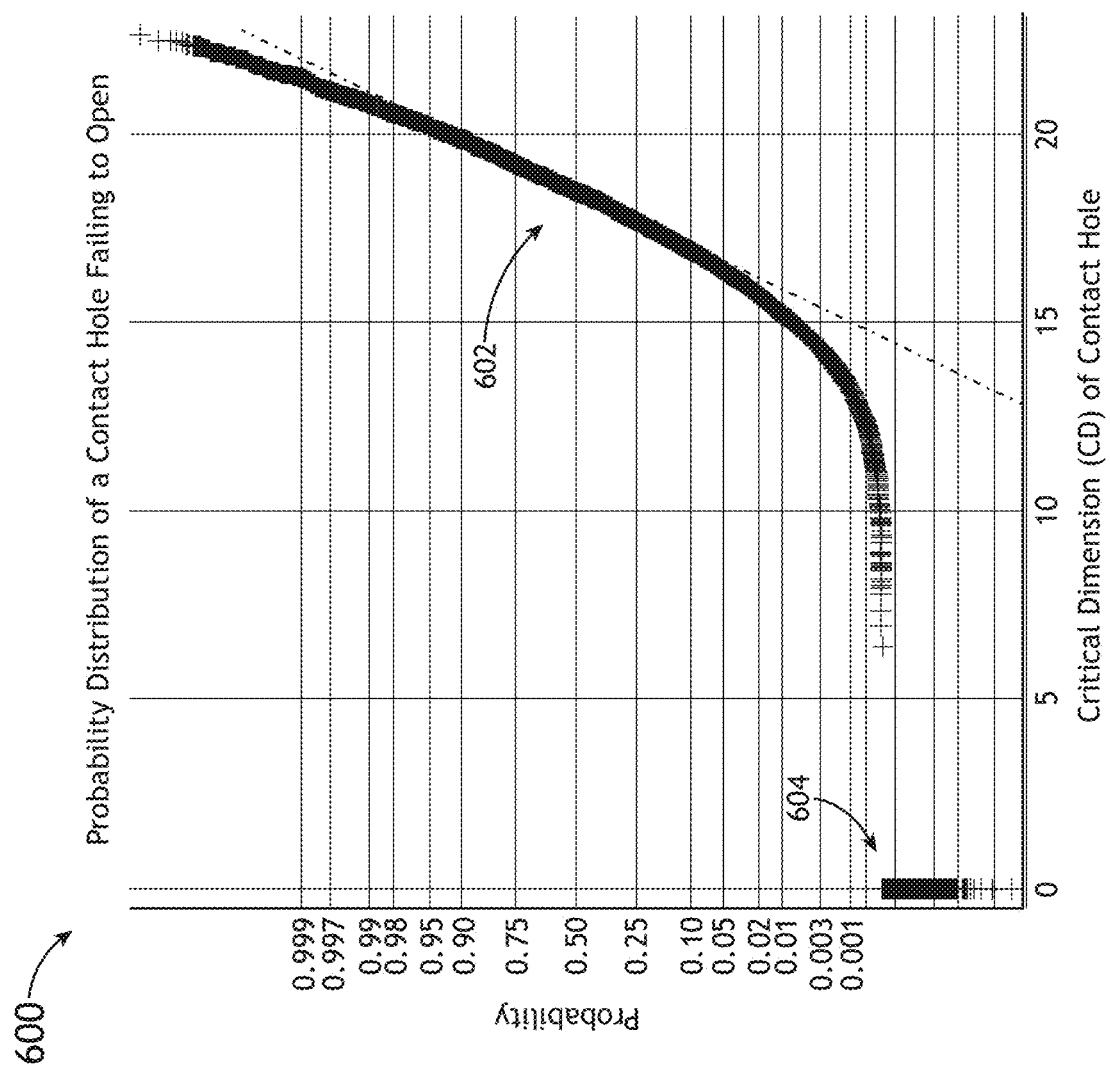
FIG. 6 is a plot illustrating a normal probability distribution of a contact hole fabricated on a sample failing to open, in accordance with one or more embodiments of the present disclosure.
Figure 7:
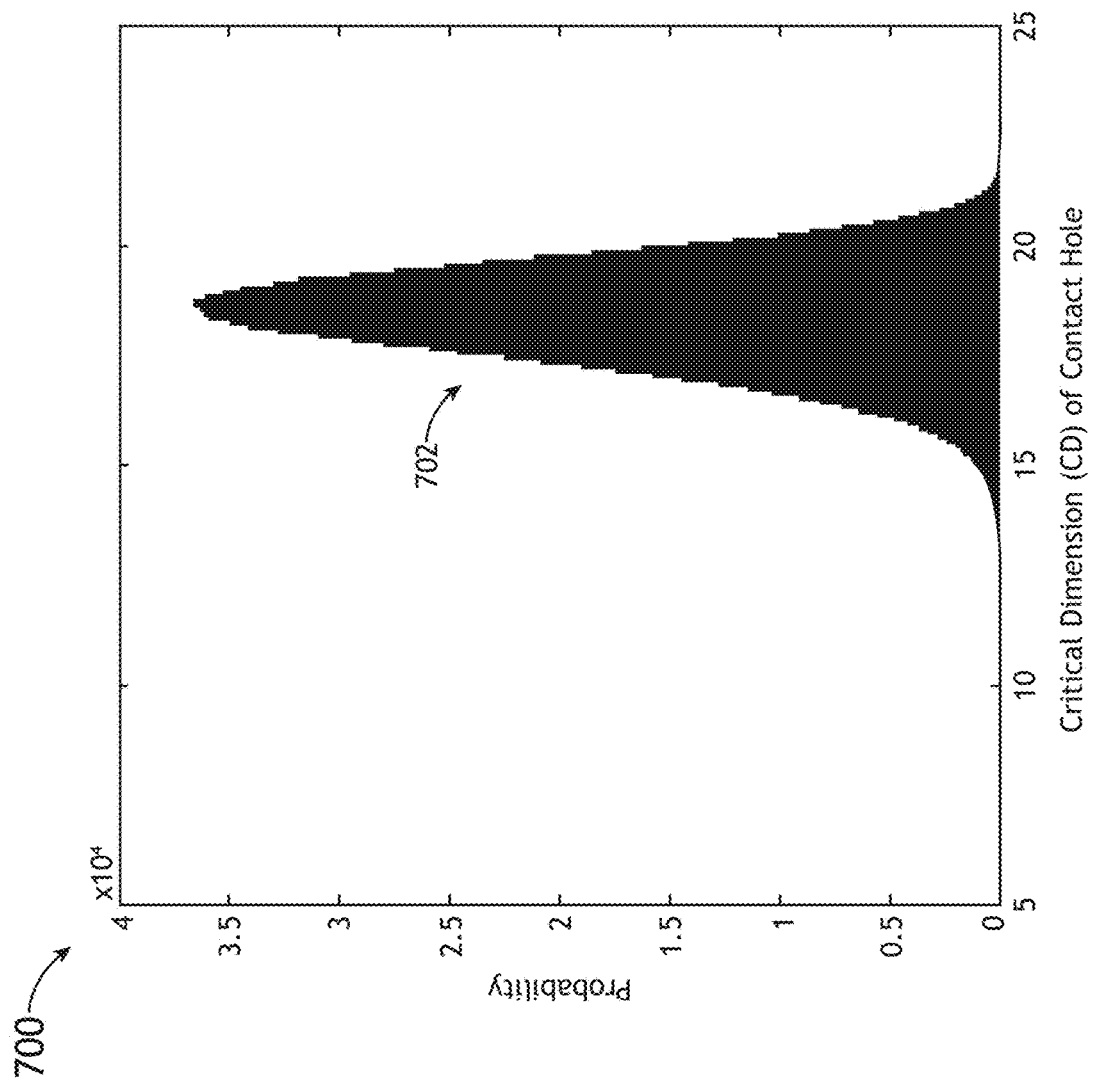
FIG. 7 is a plot illustrating a probability of a contact hole fabricated on a sample failing to open as a Gaussian distribution, in accordance with one or more embodiments of the present disclosure.

FIG. 6 is a plot 600 illustrating a normal probability distribution of a contact hole (e.g., contact hole 502a-502n in FIG. 5) fabricated on a sample (e.g., simulated product sample) failing to open, in accordance with one or more embodiments of the present disclosure. More particularly, plot 600 illustrates a simulated distribution of one-hundred-thousand stochastic simulations of a printing process used to print contact holes utilizing an advanced organic chemically amplified resist (CAR) or any other photosensitive materials such as Metal-Oxide (MOX) resists, and the like. (e.g., reticle 120). FIG. 7 is a plot 700 and curve 702 illustrating a probability of a contact hole (e.g., contact hole 502a-502n in FIG. 5) fabricated on a sample (e.g., simulated product sample) failing to open as a Gaussian distribution, in accordance with one or more embodiments of the present disclosure.

In this example, the controller 106 may perform thousands of stochastic simulations of a printing process using a product reticle 120 to simulate fabrication of contact holes on thousands of simulated product samples. Subsequently, the controller 106 may acquire critical dimension (CD) measurements of the simulated contact holes (e.g., simulated metrology data). The controller 106 may then plot the identified CD measurements of the simulated contact holes on the x-axis against the probability of the contact holes failing to open (CD=0) on the y-axis, as shown in the curve 602 of plot 600. In this regard, curve 602 illustrates the probability of simulated contact holes having a particular CD.

Curve 602 illustrates that there is a less than 0.001 probability that a contact hole would fail to open according to the printing processes applied with the product reticle 120. However, the non-normal distribution tail 604 of the curve 602 illustrates a probability below 0.05 for low CDs. This non-normal distribution tail 604 may be attributable to stochastic variation resulting from defects in the reticle 120 and/or the printing process itself.

While the plot 600 and curve 602 illustrates potential stochastic variation of CD measurements within printed patterns of elements, it is contemplated herein that the plot 600 (or similar plots) may additionally and/or alternatively be generated to illustrate various other characteristics of simulated product samples including, but not limited to, overlay error, pattern placement error, critical dimensions (CD), dimensions of sample features, sidewall angle, line edge roughness, pattern placement errors (PPE), edge placement errors (EPE), and the like. By way of another example, plot 600 (or similar plots) may additionally and/or alternatively be generated to illustrate other characteristics of contact holes other than percentages of closed contact holes (CD=0) inducing, but not limited to, micro-bridges or breaks.

As noted previously herein, the product model may be generated by the controller 106 based on the simulated product samples may include any mathematical model or modeling technique known in the art including, but not limited to, principal component analysis (PCA), machine learning algorithms or classifiers, and the like. For example, in some embodiments, the product model may include a product model which describes/models the curve 602 illustrated in FIG. 6. For instance, after plotting curve 602, the controller 106 may generate the product model by fitting one or more distribution functions to the curve 602, and fitting various models to the one or more distribution functions. In this example, the product model may be generated such that it models the entirety of the curve 602 well beyond traditional 3-sigma limits, including the non-normal distribution tail 604. In this regard, the product models may be generated to fit simulated metrology data of the simulated product samples.

In a general sense, the product model may include any model known in the art which describes/models the effects of a printing process utilizing a product reticle 120 on various characteristics of the pattern of elements printed via the printing processes.

It is noted herein that embodiments of the present disclosure may reduce the computational requirements for simulating and/or modeling the effects of a printing process. In particular, embodiments of the present disclosure have been found to significantly reduce computational time from tens-of-thousands of simulations down to a manageable number of stochastic simulations (e.g., Monte Carlo simulations) by characterizing distribution functions (e.g., distribution function of CD illustrated in plot 600) in reduced terms, as compared to conventional reticle dispositioning techniques.

For example, it is noted herein that some conventional reticle dispositioning techniques may utilize a single simulation of the impact of reticle defect printability. This conventional single simulation may only estimate a shift in the center of a CD distribution (peak of curve 602), and may fail to comprehend the impact of stochastic defectivity within non-normal distribution tails 604 of the curve 602. Accordingly, some conventional reticle dispositioning techniques would not identify or capture the number of closed contacts (CD=0) of the contact holes attributable to stochastic defectivity, which may result in reduced device yield and/or total circuit failure. The net result is that conventional reticle dispositioning techniques which fail to account for the full shape of the distribution (particularly the percentage of defective patterns/elements) may result in a decision to pass a defective reticle, which could lead to significant financial losses. Therefore, by allowing for pass/fail decisions of a product reticle to be made based on the frequency of failed patterns/elements across the entirety of an element distribution (e.g., not-OK percentage) rather than a single value (e.g., single CD value), embodiments of the present disclosure may enable more accurate and efficient reticle dispositioning capabilities.

Reference will again be made to FIG. 4. In a step 408, at least one of a care area of the product reticle 120 which is susceptible to printing stochastic defects on product samples or a care area on the one or more simulated product samples which is susceptible to printed stochastic defects is determined based on the product model. It is noted herein that the term "care area" may be used to refer to locations/regions on the product reticle 120 and/or simulated product samples (or future samples 124 fabricated via the product reticle 120) which are susceptible to stochastic defects. In this regard, care areas may include fabrication defects predicted to occur stochastically when fabricated according to the production recipe as described previously herein. Accordingly, care areas may correspond to locations at which one or more defects may occur stochastically. For example, care areas may include both failure points associated with deterministic repeaters (e.g., defects predicted to occur for each fabrication run in the same location) as well as identified weak points that may be susceptible to stochastic repeaters. Identified weak points may include features within the pattern of elements (e.g., particular sizes or shapes of elements, distances between particular elements, or the like) that may be within specification, but are far from nominal values.

For example, a care area on the product reticle 120 may include a location, area, or region of the product reticle 120 which has been identified as potentially inducing stochastic defects within product samples when the product samples are fabricated via the simulated printing processes using the product reticle 120. By way of another example, a care area on the simulated product samples may include a location, area, or region of the simulated product samples (or future samples 124 fabricated via the product reticle 120) which may be more susceptible to stochastic defects or variation. In embodiments, the controller 106 may be configured to store the one or more identified care areas of the product reticle 120 and/or the one or more identified care areas of the simulated product samples in memory 110.

Care areas susceptible to stochastic repeaters may be associated with either a reticle or pattern mask (e.g., product reticle 120) including the pattern of elements to be exposed on a product sample 125 or a layer of the product sample 125 after any production step (e.g., ADI or AEI of any layer). For example, the identification of care areas on a product reticle 120 susceptible to stochastic defects may be utilized in a print check process to enable corrective actions (e.g., modification of the production recipe to mitigate the fabrication of stochastic defects or the generation of metrology recipes to monitor stochastic defects) prior to wafer fabrication. By way of another example, the identification of care areas on simulated product samples susceptible to stochastic repeaters may be utilized in any process-monitoring application including, but not limited to, hot spot identification, a PWG analysis, or a WET analysis. Care areas and identification of stochastic defects are further shown and described by Biafore et al. in U.S. Pat. No. 10,474,042, filed on Jun. 2, 2017, entitled STOCHASTICALLY-AWARE METROLOGY FABRICATION, which is incorporated herein by reference in the entirety.

In some embodiments, the controller 106 may be configured to identify care areas susceptible to stochastic defects/stochastic variation by comparing the generated product model to a reference model. This may be further understood with reference to FIG. 4B.

Figure 4B:
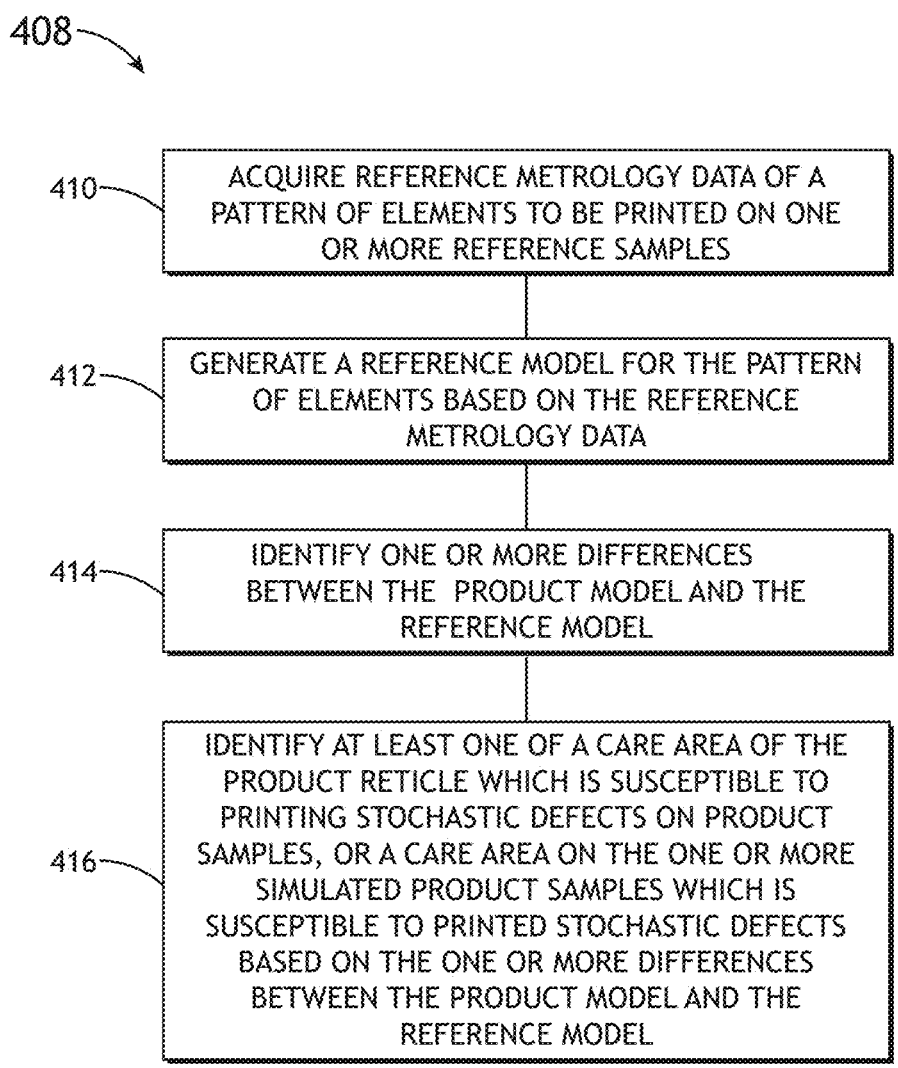
FIG. 4B illustrates a flowchart of a method for identifying stochastic defects on a specimen, in accordance with one or more embodiments of the present disclosure.

FIG. 4B illustrates a flowchart of a portion of method 400 for identifying stochastic defects on a specimen 125 (e.g., reticle 120, sample 124), in accordance with one or more embodiments of the present disclosure. More particularly, FIG. 4B illustrates sub-steps for identifying care areas by comparing a product model to a reference model.

In a step 410, reference metrology data of a pattern of elements to be printed on one or more reference samples is acquired. As noted previously herein, the term "reference samples" "reference reticle" may be used to refer to a reticle 120 which is known to exhibit good stochastic variability. In particular, a reference reticle 120 may include a reticle which is known to exhibit good stochastic variability, and which may be used in printing processes to fabricate patterns of elements on reference samples 124, which are also known to exhibit good stochastic variability. In this regard, a reference reticle 120 may be known to utilize one or more printing processes in order to fabricate reference samples 124 with low stochastic variability. Thus, it is contemplated herein that comparing stochastic defectivity/stochastic variability of the product reticle 120/product samples to that of the reference reticle 120/reference samples may enable improved dispositioning and analysis of the product reticle 120.

Reference metrology data of reference samples 124 may be acquired from any source known in the art. For example, the controller 106 may cause the lithography sub-system 102 to print a pattern of elements on one or more reference samples 124 using a reference reticle 120. Subsequently, the controller 106 may be configured to generate one or more control signals configured to cause the metrology sub-system 104 to acquire one or more images of reference samples 124 (e.g., metrology specimen 125). The acquired images may include optical images from the optical metrology sub-system 104a and/or SEM images from the SEM metrology sub-system 104b. The controller 106 may then be configured to receive the acquired images and generate reference metrology data of the reference samples 124 based on the acquired images.

In additional and/or alternative embodiments, the reference metrology data of the reference samples 124 may be based on design data of the reference samples 124 itself. Design data of the reference reticle 120 may include a fabrication recipe used to fabricate the reference samples 124. For example, design data (e.g., a fabrication recipe) associated with the reference samples 124 may be stored in memory 110 and/or a remote memory or server. In this example, the controller 106 may be configured to acquire the reference metrology data of the reference samples 124 based on the design data of the reference samples 124. In embodiments, the controller 106 may be configured to store reference metrology data of the reference samples 124 in memory 110.

In additional and/or alternative embodiments, reference metrology data of reference samples 124 may be acquired by performing stochastic simulations (e.g., Monte Carlo simulations) on a reference reticle 120, as described previously herein. For example, the controller 106 may be configured to acquire one or more measurements of a reference reticle 120, and perform one or more stochastic simulations of a printing process based on the one or more measurements of the reference reticle to generate one or more simulated reference samples. Subsequently, as described previously herein, simulated metrology data of the one or more simulated reference samples may be acquired.

In a step 412, a reference model of the reference reticle 120 modeling the printing process of the pattern of elements by the reference reticle is generated. It is noted herein that any description associated with generating the product model in step 406 may be regarded as applying to generating the reference model in step 412, to the extent applicable, and unless noted otherwise herein.

In embodiments, the reference model of the reference reticle 120 may be generated based on the reference metrology data acquired in step 410. For example, the reference model may be generated based on the reference metrology data acquired directly from one or more reference samples 124 via the metrology sub-system 104. By way of another example, the reference model may be generated based on simulated metrology data acquired from one or more simulated reference samples. For instance, in the context of a reference reticle 120 used to print contact holes (e.g., contact holes 502a-502n in FIG. 5), the controller 106 may be configured to acquire critical dimensions (e.g., simulated metrology data) of the simulated contact holes printed on the simulated reference samples. Subsequently, based on the acquired critical dimensions (e.g., simulated metrology data), the controller 106 may generate a reference model which models the printing process of the contact holes on the simulated reference samples.

In a general sense, the reference model may include any model known in the art which describes/models the effects of a printing process utilizing a reference reticle 120 on various characteristics of the pattern of elements printed on reference samples 124 via the printing processes. The reference model may be generated by the controller 106 using any mathematical model or modeling technique known in the art including, but not limited to, principal component analysis (PCA), machine learning algorithms or classifiers, and the like. For example, in some embodiments, the reference model may include a reference model which describes/models a curve similar to the curve 602 illustrated in FIG. 6.

In a step 414, one or more differences between the product model and the reference model are identified. For example, the controller 106 may be configured to store both the product model and the reference model in memory 110. The controller 106 may be further configured to compare the product model and the reference model, and identify one or more differences between the product model and the reference model.

For instance, the reference model may include a model which describes/models an ideal distribution of CDs of contact holes 502a-502n printed on reference samples (or simulated reference samples). Thus, the reference model may include a model which describes/models a curve 602 illustrating CDs of reference samples with good (e.g., low) stochastic defectivity. Similarly, the product model may include a model which describes/models a distribution of CDs of contact holes 502a-502n printed on product samples (or simulated product samples). Thus, the product model may include a model which describes/models a curve 602 illustrating CDs of reference samples. In this example, by comparing the product model (for which stochastic defectivity is to be inspected) to the reference model (which has a known, good stochastic defectivity), the controller 106 may be configured to identify differences in stochastic defectivity within the product samples 124 and/or product reticle 120.

In a step 416, at least one of a care area of the product reticle 120 or a care area on the one or more simulated product samples which is susceptible to printed stochastic defects is determined based on the one or more identified differences. As noted previously herein, the term "care area" may be used to refer to locations/regions on the product reticle 120 and/or simulated product samples (or future samples 125 fabricated via the product reticle 120) which are susceptible to stochastic defects. In embodiments, after identifying differences between the reference model and the product model, the controller 106 may be configured to identify one or more care areas on the product reticle 120 and/or product samples 124 based on the identified differences.

In some embodiments, after identifying one or more care areas on the product reticle 120 and/or product samples 124, the controller 106 may be configured to determine a frequency of stochastic defects based on the identified care areas and/or based on the identified differences between the product model and the reference model. In additional and/or alternative embodiments, the controller 106 may be configured to report a reticle disposition evaluation associated with the product reticle based on the frequency of stochastic defects. In some embodiments, the controller 106 may generate one or more control signals configured to cause the user interface 112 to display the reticle disposition evaluation to a user. The reticle disposition evaluation may include any evaluation, rating, or characterization known in the art. For example, the reticle disposition evaluation may include a "passing" evaluation or a "not-passing" evaluation. For instance, in examples where the controller 106 identifies a high frequency of stochastic defects on the product reticle 120 and/or product samples 124, the controller 106 may be configured to assign/report a "not-passing" reticle disposition evaluation associated with the product reticle. By way of another example, in examples where the controller 106 identifies a low frequency of stochastic defects on the product reticle 120 and/or product samples 124, the controller 106 may be configured to assign/report a "passing" reticle disposition evaluation associated with the product reticle.

In additional and/or alternative embodiments, the controller 106 may be configured to generate one or more control signals configured to selectively adjust one or more characteristics of one or more process tools (e.g., lithography sub-system 102, metrology sub-system 104) based on at least one of the care area of the product reticle 120 or the care area of the one or more simulated product samples 124. In this regard, the controller 106 may be configured to transmit control signals in a feedback and/or feedforward control loop in order to selectively adjust one or more fabrication or inspection processes performed on the product reticle 120 and/or product samples 124.

For instance, the controller 106 may be configured to selectively modify a fabrication recipe used by the lithography sub-system 102 and/or other process tools (e.g., deposition tools, etching tools, and the like) to fabricate product samples 124 in order to reduce or eliminate the presence of stochastic defects within the product samples 124. By way of another example, the controller 106 may be configured to generate an inspection recipe which may be used by the metrology sub-system 102 to inspect the identified care areas on the product samples 124. In this regard, identification of the care areas on the product reticle 120 and/or product samples 124 may be used by the controller 106 and system 100 to facilitate and guide subsequent inspection processes (e.g., print check). By way of another example, the controller 106 may selectively modify a fabrication recipe of the product reticle 120 in order to fabricate subsequent product reticles 120 which reduce and/or eliminate identified care areas on the product reticle.

It is noted herein that the one or more components of system 100 may be communicatively coupled to the various other components of system 100 in any manner known in the art. For example, the controller 106, lithography sub-system 102, metrology sub-system 104, and user interface 112 may be communicatively coupled to each other and other components via a wireline (e.g., copper wire, fiber optic cable, and the like) or wireless connection (e.g., RF coupling, IR coupling, data network communication, WiFi, WiMax, Bluetooth, 3G, 4G, 4G LTE, 5G, and the like).

In one embodiment, the one or more processors 108 may include any one or more processing elements known in the art. In this sense, the one or more processors 108 may include any microprocessor-type device configured to execute software algorithms and/or instructions. In one embodiment, the one or more processors 108 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 108. In general, the term "processor" may be broadly defined to encompass any device having one or more processing elements, which execute program instructions from memory 110. Moreover, different subsystems of the system 100 (e.g., lithography sub-system 102, metrology sub-system 104, controller 106) may include processor or logic elements suitable for carrying out at least a portion of the steps described throughout the present disclosure. Therefore, the above description should not be interpreted as a limitation on the present disclosure but merely an illustration.

The memory 110 may include any storage medium known in the art suitable for storing program instructions executable by the associated one or more processors 108 For example, the memory 110 may include a non-transitory memory medium. For instance, the memory 110 may include, but is not limited to, a read-only memory (ROM), a random access memory (RAM), a magnetic or optical memory device (e.g., disk), a magnetic tape, a solid state drive and the like. It is further noted that memory 110 may be housed in a common controller housing with the one or more processors 108. In an alternative embodiment, the memory 110 may be located remotely with respect to the physical location of the processors 108, controller 106, and the like. In another embodiment, the memory 110 maintains program instructions for causing the one or more processors 108 to carry out the various steps described through the present disclosure.

In one embodiment, a user interface 112 is communicatively coupled to the controller 106. In one embodiment, the user interface 112 may include, but is not limited to, one or more desktops, tablets, smartphones, smart watches, or the like. In another embodiment, the user interface 112 includes a display used to display data of the system 100 to a user. The display of the user interface 112 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 112 is suitable for implementation in the present disclosure. In another embodiment, a user may input selections and/or instructions responsive to data displayed to the user via the user interface 112.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
  a controller including one or more processors configured to execute a set of program instructions stored in memory, the set of program instructions configured to cause the one or more processors to:
    acquire product metrology data of a product reticle, the product reticle configured to be used to print a pattern of elements on one or more product samples;
    perform one or more stochastic simulations of a printing process based on the product metrology data of the product reticle to generate one or more simulated product samples including the pattern of elements;
    generate a product model of the product reticle modeling the printing process of the pattern of elements by the product reticle;
    identify one or more differences between the product model and a reference model;
    identify, based on the one or more identified differences, at least one of a care area of the product reticle which is susceptible to printing stochastic defects on the one or more product samples, or a care area on the one or more simulated product samples which is susceptible to printed stochastic defects; and
    adjust one or more characteristics of one or more process tools based on at least one of the care area of the product reticle or the care area of the one or more simulated product samples.

2. The system of claim 1, wherein the controller is configured to identify, based on the one or more identified differences, at least one of the care area of the product reticle which is susceptible to printing the stochastic defects on the one or more product samples, or the care area on the one or more simulated product samples which is susceptible to printed stochastic defects by:
  acquiring reference metrology data of the pattern of elements to be printed on one or more reference samples; and
  generating the reference model for the pattern of elements based on the reference metrology data.

3. The system of claim 2, wherein acquiring the reference metrology data of the pattern of elements to be printed on the one or more reference samples comprises:
  acquiring one or more measurements of a reference reticle;
  performing the one or more stochastic simulations of the printing process based on the one or more measurements of the reference reticle to generate the one or more simulated reference samples; and
  acquiring simulated metrology data of the one or more simulated reference samples.

4. The system of claim 3, wherein the reference model is generated based on the simulated metrology data.

5. The system of claim 2, wherein acquiring the reference metrology data of the pattern of elements to be printed on the one or more reference samples comprises:
  causing a lithography sub-system to print the pattern of elements on the one or more reference samples with a reference reticle; and acquiring one or measurements of the pattern of elements on the one or more reference samples.

6. The system of claim 1, wherein the one or more stochastic simulations of the printing process are configured to simulate fabrication of the pattern of elements on the one or more simulated product samples.

7. The system of claim 1, wherein the one or more stochastic simulations comprise Monte Carlo simulations of the printing process.

8. The system of claim 1, wherein generating the product model of the product reticle modeling the printing process of the pattern of elements by the product reticle comprises:
 acquiring simulated metrology data of the one or more simulated product samples; and
 generating the product model based on the simulated metrology data.

9. The system of claim 1, wherein the controller is configured to acquire the product metrology data of the product reticle by:
 directing a metrology sub-system to acquire one or more optical images of the product reticle or one or more scanning electron microscopy (SEM) images of the product reticle;
 receiving the one or more acquired images from the metrology sub-system; and
 generating the product metrology data based on the one or more acquired images.

10. The system of claim 1, wherein the controller is configured to acquire the product metrology data of the product reticle by:
 retrieving design data of the product reticle; and
 acquiring the product metrology data of the product reticle based on the design data of the product reticle.

11. The system of claim 1, wherein the controller is further configured to: determine a frequency of the stochastic defects based on the care area of the product reticle or the care area of the one or more simulated product samples.

12. The system of claim 11, wherein the controller is further configured to: report a reticle disposition evaluation associated with the product reticle based on the frequency of the stochastic defects.

13. The system of claim 12, wherein the reticle disposition evaluation comprises a passing evaluation or a not-passing evaluation.

14. The system of claim 1, wherein the controller is further configured to:
 generate one or more control signals configured to selectively adjust the one or more characteristics of the one or more process tools based on at least one of the care area of the product reticle or the care area of the one or more simulated product samples.

15. A system, comprising:
 a controller including one or more processors configured to execute a set of program instructions stored in memory, the set of program instructions configured to cause the one or more processors to:
  acquire reference metrology data of a pattern of elements to be printed on one or more reference samples;
  generate a reference model of the pattern of elements based on the reference metrology data;
  acquire product metrology data of a product reticle, the product reticle configured to be used to print the pattern of elements on one or more product samples;
  perform one or more stochastic simulations of a printing process based on the product metrology data of the product reticle to generate one or more simulated product samples including the pattern of elements;
  generate a product model of the product reticle modeling the printing process of the pattern of elements by the product reticle;
  identify one or more differences between the product model and the reference model; identify, based on the one or more identified differences, at least one of a care area of the product reticle which is susceptible to printing stochastic defects on the one or more product samples, or a care area on the one or more simulated product samples which is susceptible to printed stochastic defects; and
  adjust one or more characteristics of one or more process tools based on at least one of the care area of the product reticle or the care area of the one or more simulated product samples.

16. The system of claim 15, wherein acquiring the reference metrology data of the pattern of elements to be printed on the one or more reference samples comprises:
 acquiring one or more measurements of a reference reticle;
 performing the one or more stochastic simulations of the printing process based on the one or more measurements of the reference reticle to generate one or more simulated reference samples; and
 acquiring simulated metrology data of the one or more simulated reference samples.

17. The system of claim 16, wherein the reference model is generated based on the simulated metrology data.

18. The system of claim 15, wherein acquiring the reference metrology data of the pattern of elements to be printed on the one or more reference samples comprises:
 causing the one or more process tools to print the pattern of elements on the one or more reference samples with a reference reticle; and
 acquiring one or more measurements of the pattern of elements on the one or more reference samples.

19. The system of claim 15, wherein generating the product model of the product reticle modeling the printing process of the pattern of elements by the product reticle comprises:
 acquiring simulated metrology data of the one or more simulated product samples; and
 generating the product model based on the simulated metrology data.

20. The system of claim 15, wherein the one or more stochastic simulations comprise Monte Carlo simulations of the printing process.

21. The system of claim 15, wherein the controller is configured to acquire the product metrology data of the product reticle by:
 directing a metrology sub-system to acquire one or more optical images of the product reticle or one or more scanning electron microscopy (SEM) images of the product reticle;
 receiving the one or more acquired images from the metrology sub-system; and
 generating the product metrology data based on the one or more acquired images.

22. The system of claim 15, wherein the controller is configured to acquire the product metrology data of the product reticle by:
 retrieving design data of the product reticle; and
 acquiring the product metrology data of the product reticle based on the design data of the product reticle.

23. The system of claim 15, wherein the controller is further configured to: determine a frequency of the stochastic defects based on the care area of the product reticle or the care area of the one or more simulated product samples.

24. The system of claim 23, wherein the controller is further configured to: report a reticle disposition evaluation associated with the product reticle based on the frequency of the stochastic defects.

25. The system of claim 24, wherein the reticle disposition evaluation comprises a passing evaluation or a not-passing evaluation.

26. The system of claim 15, wherein the controller is further configured to:
generate one or more control signals configured to selectively adjust the one or more characteristics of the one or more process tools based on at least one of the care area of the product reticle or the care area of the one or more simulated product samples.

27. A method for identifying stochastic defects, comprising:
acquiring product metrology data of a product reticle, the product reticle configured to be used to print a pattern of elements on one or more product samples;
performing one or more stochastic simulations of a printing process based on the product metrology data of the product reticle to generate one or more simulated product samples including the pattern of elements;
generating a product model of the product reticle modeling the printing process of the pattern of elements by the product reticle;
identifying one or more differences between the product model and a reference model;
identifying, based on the one or more identified differences, at least one of a care area of the product reticle which is susceptible to printing the stochastic defects on the one or more product samples, or a care area on the one or more simulated product samples which is susceptible to printed stochastic defects; and
adjusting one or more characteristics of one or more process tools based on at least one of the care area of the product reticle or the care area of the one or more simulated product samples.

28. A method for identifying stochastic defects, comprising:
acquiring reference metrology data of a pattern of elements to be printed on one or more reference samples;
generating a reference model of the pattern of elements based on the reference metrology data;
acquiring product metrology data of a product reticle, the product reticle configured to be used to print the pattern of elements on one or more product samples;
performing one or more stochastic simulations of a printing process based on the product metrology data of the product reticle to generate one or more simulated product samples including the pattern of elements;
generating a product model of the product reticle modeling the printing process of the pattern of elements by the product reticle;
identifying one or more differences between the product model and the reference model;
identifying, based on the one or more identified differences, at least one of a care area of the product reticle which is susceptible to printing the stochastic defects on the one or more simulated product samples, or a care area on the one or more product samples which is susceptible to printed stochastic defects; and
adjusting one or more characteristics of one or more process tools based on at least one of the care area of the product reticle or the care area of the one or more simulated product samples.

* * * * *